United States Patent
Ershov et al.

(10) Patent No.: US 10,128,017 B1
(45) Date of Patent: Nov. 13, 2018

(54) APPARATUS FOR AND METHOD OF CONTROLLING DEBRIS IN AN EUV LIGHT SOURCE

(71) Applicant: ASML Netherlands B.V., Veldhoven (NL)

(72) Inventors: Alexander I. Ershov, San Diego, CA (US); John Tom Stewart, IV, San Diego, CA (US); Igor V. Fomenkov, San Diego, CA (US); Christianus W. J. Berendsen, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/593,732

(22) Filed: May 12, 2017

(51) Int. Cl.
*G21K 1/06* (2006.01)
*H05G 2/00* (2006.01)

(52) U.S. Cl.
CPC ............. *G21K 1/067* (2013.01); *H05G 2/008* (2013.01)

(58) Field of Classification Search
CPC ................................ G21K 1/067; H05G 2/008
See application file for complete search history.

(56) References Cited

U.S. PATENT DOCUMENTS

| | | | |
|---|---|---|---|
| 2013/0186976 A1* | 7/2013 | Ishihara | B05B 17/06 239/102.1 |
| 2014/0203195 A1* | 7/2014 | Fleurov | H05G 2/008 250/504 R |
| 2015/0062544 A1* | 3/2015 | Ershov | G03F 7/70033 355/30 |
| 2016/0278195 A1* | 9/2016 | Kim | H05G 2/006 |

* cited by examiner

Primary Examiner — Hugh H Maupin
(74) Attorney, Agent, or Firm — Arent Fox LLP (57) ABSTRACT

Disclosed is an EUV system in which a source control loop is established to maintain and optimize debris flux while not unduly affecting optimum EUV generation conditions. One or more temperature sensors, e.g., thermocouples may be installed in the vessel to measure respective local gas temperatures. The respective local temperature as measured by the one or more thermocouples can be used as one or more inputs to the source control loop. The source control loop may then adjust the laser targeting to permit optimization of debris generation and deposition while not affecting EUV production, thus extending the lifetime of the source and its collector.

20 Claims, 4 Drawing Sheets

APPARATUS FOR AND METHOD OF CONTROLLING DEBRIS IN AN EUV LIGHT SOURCE

FIELD

The present disclosure relates to apparatus for and methods of generating extreme ultraviolet ("EUV") radiation from a plasma created through discharge or laser ablation of a target material in a vessel. In such applications optical elements are used, for example, to collect and direct the radiation for use in semiconductor photolithography and inspection.

BACKGROUND

Extreme ultraviolet radiation, e.g., electromagnetic radiation having wavelengths of around 50 nm or less (also sometimes referred to as soft x-rays), and including radiation at a wavelength of about 13.5 nm, can be used in photolithography processes to produce extremely small features in substrates such as silicon wafers.

Methods for generating EUV radiation include converting a target material to a plasma state. The target material preferably includes at least one element, e.g., xenon, lithium or tin, with one or more emission lines in the EUV portion of the electromagnetic spectrum. The target material can be solid, liquid, or gas. In one such method, often termed laser produced plasma ("LPP"), the required plasma can be produced by using a laser beam to irradiate a target material having the required line-emitting element.

One LPP technique involves generating a stream of target material droplets and irradiating at least some of the droplets with one or more laser radiation pulses. Such LPP sources generate EUV radiation by coupling laser energy into a target material having at least one EUV emitting element, creating a highly ionized plasma with electron temperatures of several 10's of eV.

For this process, the plasma is typically produced in a sealed vessel, e.g., a vacuum chamber, and the resultant EUV radiation is monitored using various types of metrology equipment. In addition to generating EUV radiation, the processes used to generate plasma also typically generate undesirable by-products in the plasma chamber which can include out-of-band radiation, high energy ions and debris, e.g., atoms and/or clumps/microdroplets of residual target material.

The energetic radiation is emitted from the plasma in all directions. In one common arrangement, a near-normal-incidence mirror (often termed a "collector mirror" or simply a "collector") is positioned to collect, direct, and, in some arrangements, focus at least a portion of the radiation to an intermediate location. The collected radiation may then be relayed from the intermediate location to a set of optics, a reticle, detectors and ultimately to a silicon wafer.

In the EUV portion of the spectrum it is generally regarded as necessary to use reflective optics for the optical elements in the system including the collector, illuminator, and projection optics box. These reflective optics may be implemented as normal incidence optics as mentioned or as grazing incidence optics. At the wavelengths involved, the collector is advantageously implemented as a multi-layer mirror ("MLM"). As its name implies, this MLM is generally made up of alternating layers of material (the MLM stack) over a foundation or substrate. System optics may also be configured as a coated optical element even if it is not implemented as an MLM.

The optical element must be placed within the vessel with the plasma to collect and redirect the EUV radiation. The environment within the chamber is inimical to the optical element and so limits its useful lifetime, for example, by degrading its reflectivity. An optical element within the environment may be exposed to high energy ions or particles of target material. The particles of target material, which are essentially debris from the laser vaporization process, can contaminate the optical element's exposed surface. Particles of target material can also cause physical damage to and localized heating of the MLM surface.

In some systems $H_2$ gas at pressures in the range of 0.5 to 3 mbar is used in the vacuum chamber as a buffer gas for debris mitigation. In the absence of a gas, at vacuum pressure, it would be difficult to protect the collector adequately from target material debris ejected from the irradiation region. Hydrogen is relatively transparent to EUV radiation having a wavelength of about 13.5 nm and so is preferred to other candidate gases such as He, Ar, or other gases which exhibit a higher absorption at about 13.5 nm.

$H_2$ gas is introduced into the vacuum chamber to slow down the energetic debris (ions, atoms, and clusters) of target material created by the plasma. The debris is slowed down by collisions with the gas molecules. For this purpose a flow of $H_2$ gas is used which may also be counter to the debris trajectory and away from the collector. This serves to reduce the damage of deposition, implantation, and sputtering target material on the optical coating of the collector.

The process of generating EUV light may also cause target material to be deposited on the walls of the vessel. Minimizing target material deposition on the vessel walls is important for achieving an acceptably long lifetime of EUV sources placed in production. Also, maintaining the direction of target material flux from the irradiation site and directionality of power dissipation into the buffer gas is important for ensuring that the waste target material mitigation system works as intended and can acceptably manage by-products associated with vaporization of the target material.

SUMMARY

The following presents a simplified summary of one or more embodiments in order to provide a basic understanding of the embodiments. This summary is not an extensive overview of all contemplated embodiments and is not intended to identify key or critical elements of all embodiments nor set limits on the scope of any or all embodiments. Its sole purpose is to present some concepts of one or more embodiments in a simplified form as a prelude to the more detailed description that is presented later.

According to one aspect, a source control loop is established to maintain and optimize debris flux while not unduly affecting optimum EUV generation conditions. One or more temperature sensors, e.g., thermocouples, may be installed in the vessel to measure respective local gas temperatures. The respective local temperature as measured by the one or more thermocouples can be used as one or more inputs to the source control loop. The source control loop may then adjust the drive laser targeting, i.e., targeting of the laser used to vaporize target material, to permit optimization of debris generation and deposition while not affecting EUV production, thus extending the lifetime of the source and its collector.

According to one aspect there is disclosed an apparatus for generating EUV radiation in which the apparatus includes a vessel, a laser adapted to generate laser radiation, and a laser steering system arranged to receive the laser radiation and adapted to steer the laser radiation to an irradiation region within the vessel. The apparatus also includes a target material delivery system adapted to deliver target material to the irradiation region to be irradiated by the laser, the irradiation of the target material by the laser generating the EUV radiation. A target material steering system coupled to the target material delivery system for adjusting a position of the target material within the irradiation region. The apparatus also includes an EUV radiation metrology system adapted to measure at least one operating parameter of the EUV radiation and to generate a first signal indicative of a value of the operating parameter, a temperature sensor arranged at a position within the vessel and adapted to measure a temperature within the vessel at the position and to generate a temperature signal indicative of a value of the measured temperature, and a controller adapted to receive the first signal and the temperature signal and to generate a control signal based at least in part on the measured temperature and to provide the control signal to at least one of the laser steering system and the target material steering system to adjust interaction of the laser radiation and the target material in the irradiation region.

The apparatus may further include an EUV optical element located within the vessel and wherein the position at which the temperature sensor is arranged may be gravitationally above the EUV optical element. The EUV optical element may be a collector mirror. The temperature sensor may be arranged on an internal wall of the vessel. The temperature sensor may be or include a thermocouple. The apparatus may also include a second temperature sensor arranged at a second position within the vessel and adapted to measure a second temperature within the vessel at the second position and to generate a second temperature signal indicative of a value of the second measured temperature and the controller may be adapted to receive the second temperature signal and to generate the control signal based at least in part on the second measured temperature.

According to another aspect there is disclosed an apparatus for generating EUV radiation, the apparatus including a vessel, a laser adapted to generate laser radiation, and a laser steering system arranged to receive the laser radiation and adapted to steer the laser radiation to an irradiation region within the vessel. The apparatus also includes a target material delivery system adapted to deliver target material to the irradiation region to be irradiated by the laser, the irradiation of the target material by the laser generating the EUV radiation. And an EUV optical element located within the vessel. A first temperature sensor is arranged at a first position within the vessel gravitationally above the EUV optical element and adapted to measure a first measured temperature within the vessel at the first position and to generate a first temperature signal indicative of a value of the first measured temperature. A second temperature sensor is arranged at a second position within the vessel and adapted to measure a second temperature of a gas within the vessel at the second position and to generate a second temperature signal indicative of a value of the second measured temperature. A controller is adapted to receive the first signal and the temperature signal and to generate a control signal based at least in part on the first measured temperature and the second measured temperature to provide the control signal to the laser steering system to adjust an angle at which the laser radiation strikes the target material in the irradiation region. The EUV optical element may be or include a collector mirror. The first temperature sensor may be arranged is on an internal wall of the vessel and the second temperature sensor may arranged is on an internal wall of the vessel. The first temperature sensor may be a thermocouple and the second temperature sensor may be a second thermocouple.

According to another aspect there is disclosed an apparatus for generating EUV radiation, the apparatus including a vessel, a laser adapted to generate a laser beam, and a laser steering system arranged to receive the laser beam and adapted to direct the laser beam to and adjust a tilt of the laser beam in irradiation region within the vessel. The apparatus also includes a target material delivery system adapted to deliver target material to the irradiation region to be irradiated by the laser beam, the irradiation of the target material by the laser beam generating the EUV radiation, a temperature sensor arranged at a position within the vessel and adapted to measure a temperature within the vessel at the position and to generate a temperature signal indicative of a value of the measured temperature, and a controller adapted to receive the temperature signal and to generate a control signal based at least in part on the value of the temperature signal and to provide the control signal to the laser steering system to adjust the tilt of the laser beam. The tilt may be adjusted to maintain the temperature below a predetermined maximum value. The apparatus may also include a second temperature sensor arranged at a second position within the vessel and adapted to measure a second temperature within the vessel at the second position and to generate a second temperature signal indicative of a second value of the measured temperature and the controller may be further adapted to receive the second temperature signal and to generate the control signal based at least in part on the second value of the second temperature signal and to provide the control signal to the laser steering system to adjust the tilt of the laser beam.

The apparatus as claimed may also include an EUV optical element located within the vessel and wherein the position at which the temperature sensor is arranged is gravitationally above the EUV optical element. The EUV optical element may be or include a collector mirror. The position at which the temperature sensor is arranged is on an internal wall of the vessel. The temperature sensors may be or include thermocouples.

According to another aspect there is disclosed an apparatus for generating EUV radiation, the apparatus including a vessel, a laser adapted to generate a laser beam, and a laser steering system arranged to receive the laser beam and adapted to direct the laser beam to and adjust a tilt of the laser beam in irradiation region within the vessel. The apparatus also includes a target material delivery system adapted to deliver target material to the irradiation region to be irradiated by the laser beam, the irradiation of the target material by the laser beam generating the EUV radiation 18. The apparatus also includes a plurality of temperature sensors arranged at respective positions within the vessel and adapted to measure a temperature within the vessel at the respective position and to generate a plurality of temperature signals indicative of values of the measured temperatures and a controller adapted to receive the plurality of temperature signals and to generate a control signal based at least in part on the value of the temperature signals and to provide the control signal to the laser steering system to adjust the tilt of the laser beam. The apparatus may also include an EUV optical element located within the vessel and the position at which at least one of the plurality of temperature sensors is arranged may gravitationally above the EUV optical element. Each of the plurality of temperature sensors may be or include a thermocouple.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments.

Figure 1:
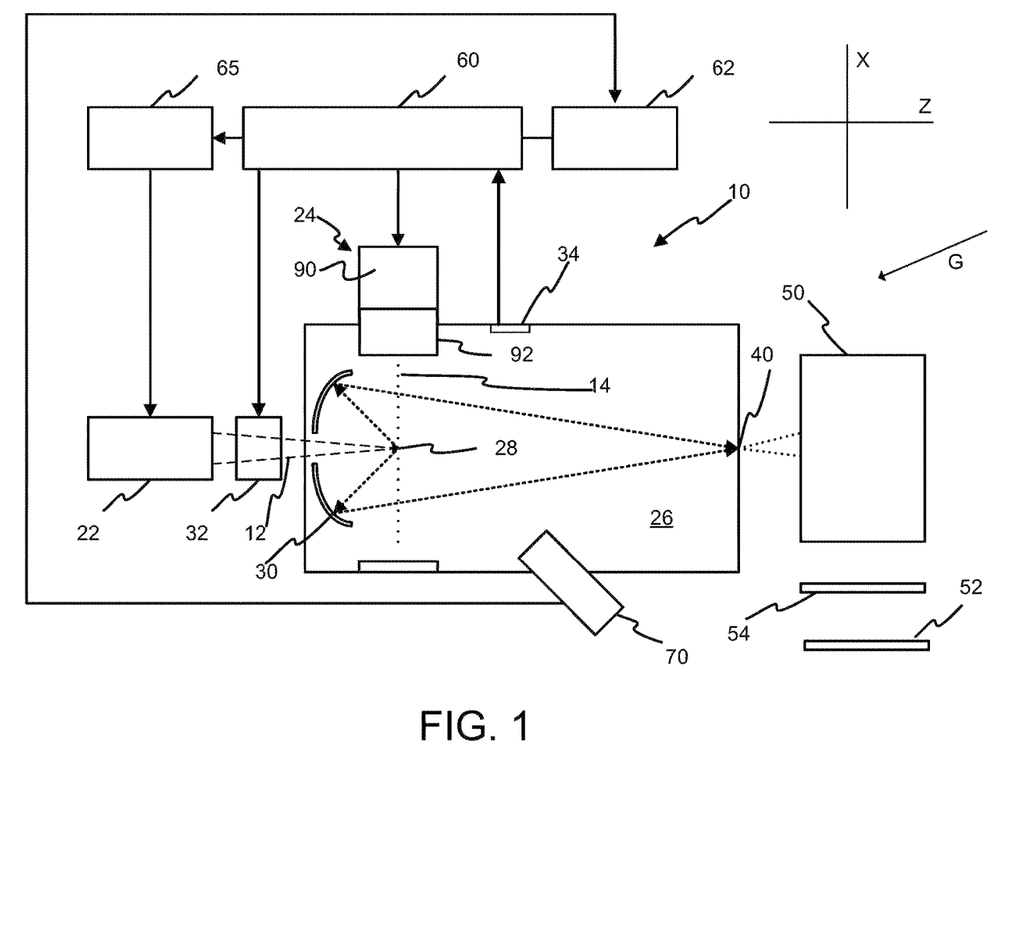
FIG. 1 is a schematic, not-to-scale view of an overall broad conception for a laser-produced plasma EUV radiation source system according to an aspect of the present invention.

With initial reference to FIG. 1 there is shown a schematic view of an exemplary EUV radiation source, e.g., a laser produced plasma EUV radiation source 10 according to one aspect of an embodiment of the present invention. As shown, the EUV radiation source 10 may include a pulsed or continuous laser source 22, which may for example be a pulsed gas discharge $CO_2$ laser source producing a beam 12 of radiation at 10.6 µm or 1 µm. The pulsed gas discharge $CO_2$ laser source may have DC or RF excitation operating at high power and at a high pulse repetition rate.

The EUV radiation source 10 also includes a target delivery system 24 for delivering target material in the form of liquid droplets or a continuous liquid stream. In this example, the target material is a liquid, but it could also be a solid or gas. The target material may be made up of tin or a tin compound, although other materials could be used. In the system depicted the target material delivery system 24 introduces droplets 14 of the target material into the interior of a vacuum chamber 26 to an irradiation region 28 where the target material may be irradiated to produce plasma. In some cases, an electrical charge is placed on the target material to permit the target material to be steered toward or away from the irradiation region 28. It should be noted that as used herein an irradiation region is a region where target material irradiation may occur, and is an irradiation region even at times when no irradiation is actually occurring. The EUV light source may also include a beam steering system 32 as will be explained in more detail below in conjunction with FIG. 2.

In the system shown, the components are arranged so that the droplets 14 travel substantially horizontally. The direction from the laser source 22 towards the irradiation region 28, that is, the nominal direction of propagation of the beam 12, may be taken as the Z axis. The path the droplets 14 take from the target material delivery system 24 to the irradiation region 28 may be taken as the X axis. The view of FIG. 1 is thus normal to the XZ plane. The orientation of the EUV radiation source 10 is preferably rotated with respect to gravity as shown, with the arrow G showing the preferred orientation with respect gravitationally down. This orientation applies to the EUV source but not necessarily to optically downstream components such as a scanner and the like. Also, while a system in which the droplets 14 travel substantially horizontally is depicted, it will be understood by one having ordinary skill in the art the other arrangements can be used in which the droplets travel vertically or at some angle with respect to gravity between and including 90 degrees (horizontal) and 0 degrees (vertical).

The EUV radiation source 10 may also include an EUV light source controller system 60, which may also include a laser firing control system 65, along with the beam steering system 32. The EUV radiation source 10 may also include a detector such as a target position detection system which may include one or more droplet imagers 70 that generate an output indicative of the absolute or relative position of a target droplet, e.g., relative to the irradiation region 28, and provide this output to a target position detection feedback system 62.

The target position detection feedback system 62 may use the output of the droplet imager 70 to compute a target position and trajectory, from which a target error can be computed. The target error can be computed on a droplet-by-droplet basis, or on average, or on some other basis. The target error may then be provided as an input to the light source controller 60. In response, the light source controller 60 can generate a control signal such as a laser position, direction, or timing correction signal and provide this control signal to the laser beam steering system 32. The laser beam laser beam steering system 32 can use the control signal to change the location and/or focal power of the laser beam focal spot within the chamber 26. The laser beam steering system 32 can also use the control signal to change the geometry of the interaction of the beam 12 and the droplet 14. For example, the beam 12 can be made to strike the droplet 14 off-center or at an angle of incidence other than directly head-on.

As shown in FIG. 1, the target material delivery system 24 may include a target delivery control system 90. The target delivery control system 90 is operable in response to a signal, for example, the target error described above, or some quantity derived from the target error provided by the system controller 60, to adjust paths of the target droplets 14 through the irradiation region 28. This may be accomplished, for example, by repositioning the point at which a target delivery mechanism 92 releases the target droplets 14. The droplet release point may be repositioned, for example, by tilting the target delivery mechanism 92 or by shifting the target delivery mechanism 92. The target delivery mechanism 92 extends into the chamber 26 and is preferably externally supplied with target material and a gas source to place the target material in the target delivery mechanism 92 under pressure.

Continuing with FIG. 1, the radiation source 10 may also include one or more optical elements. In the following discussion, a collector 30 is used as an example of such an optical element, but the discussion applies to other optical elements as well. The collector 30 may be a normal incidence reflector, for example, implemented as an MLM with additional thin barrier layers, for example $B_4C$, ZrC, $Si_3N_4$ or C, deposited at each interface to effectively block thermally-induced interlayer diffusion. Other substrate materials, such as aluminum (Al) or silicon (Si), can also be used. The collector 30 may be in the form of a prolate ellipsoid, with a central aperture to allow the laser radiation 12 to pass through and reach the irradiation region 28. The collector 30 may be, e.g., in the shape of a ellipsoid that has a first focus at the irradiation region 28 and a second focus at a so-called intermediate point 40 (also called the intermediate focus 40) where the EUV radiation may be output from the EUV radiation source 10 and input to, e.g., an integrated circuit lithography scanner 50 which uses the radiation, for example, to process a silicon wafer workpiece 52 in a known manner using a reticle or mask 54. The silicon wafer workpiece 52 is then additionally processed in a known manner to obtain an integrated circuit device.

The arrangement of FIG. 1 also includes a temperature sensor 34, e.g., a thermocouple positioned within the chamber 26 to measure the local temperature, i.e., temperature at the sensor, of the gas within the chamber 26. FIG. 1 shows one temperature sensor but it will be apparent that additional temperature sensors may be used. The temperature sensor 34 generates a signal indicative of the measured temperature and supplies it as an additional input to the controller 60. The controller 60 bases the control signal it supplies to the beam steering system 32 at least in part on this temperature signal.

As discussed below, it has been found that controlling the offset of beam impingement on the droplet with respect to the center of mass of the droplet ("tilt") can optimize debris control without sacrificing EUV generation performance. Specifically, it has been found that negative tilt (deliberately causing the beam to strike the droplet slightly to one side of the center of mass of the droplet) can minimize target material deposition in areas of the chamber 26 where it is desired to avoid deposition of target material without materially affecting EUV radiation production. It has also been determined that the temperature distribution in the chambers bears a correlation to the distribution of target material debris. The controller 60 thus uses the input from the temperature sensor 34 as at least a partial basis to generate a control signal. This is in conjunction with a control loop responsible for optimizing EUV generation. It has been determined that debris production and EUV generation are essentially decoupled so that successful EUV production can be achieved with limited debris production.

Figure 2:
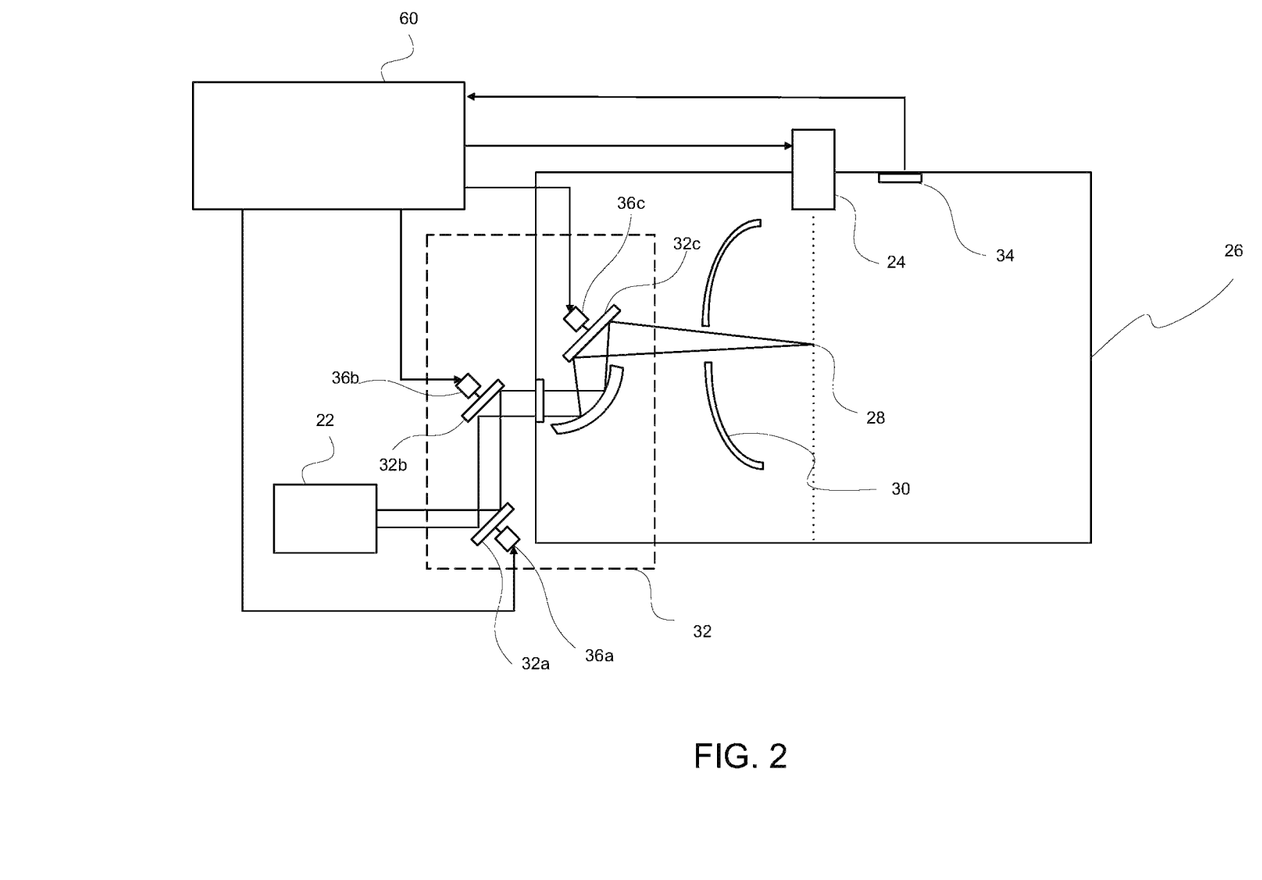
FIG. 2 is a schematic, not-to-scale view of a portion of the system of FIG. 1.

Continuing to FIG. 2, it can be seen that the beam steering system 32 may include one or more steering mirrors 32a, 32b, and 32c. Although three mirrors are shown, it is to be appreciated that more than three or as few as one steering mirror may be employed to steer the beam. Moreover, although mirrors are shown, it is to be appreciated that other optics such as prisms may be used and that one or more of the steering optics may be positioned inside the chamber 26 and exposed to plasma-generated debris. See for example U.S. Pat. No. 7,598,509 filed on Feb. 21, 2006, and titled LASER PRODUCED PLASMA EUV LIGHT SOURCE, the entire contents of which are hereby incorporated by reference herein. For the embodiment shown, each of the steering mirrors 32a, 32b, and 32c may be mounted on a respective tip-tilt actuator 36a, 36b, and 36c which may move each of the steering mirrors 32a, 32b, and 32c independently in either or both of two dimensions.

Figure 3:
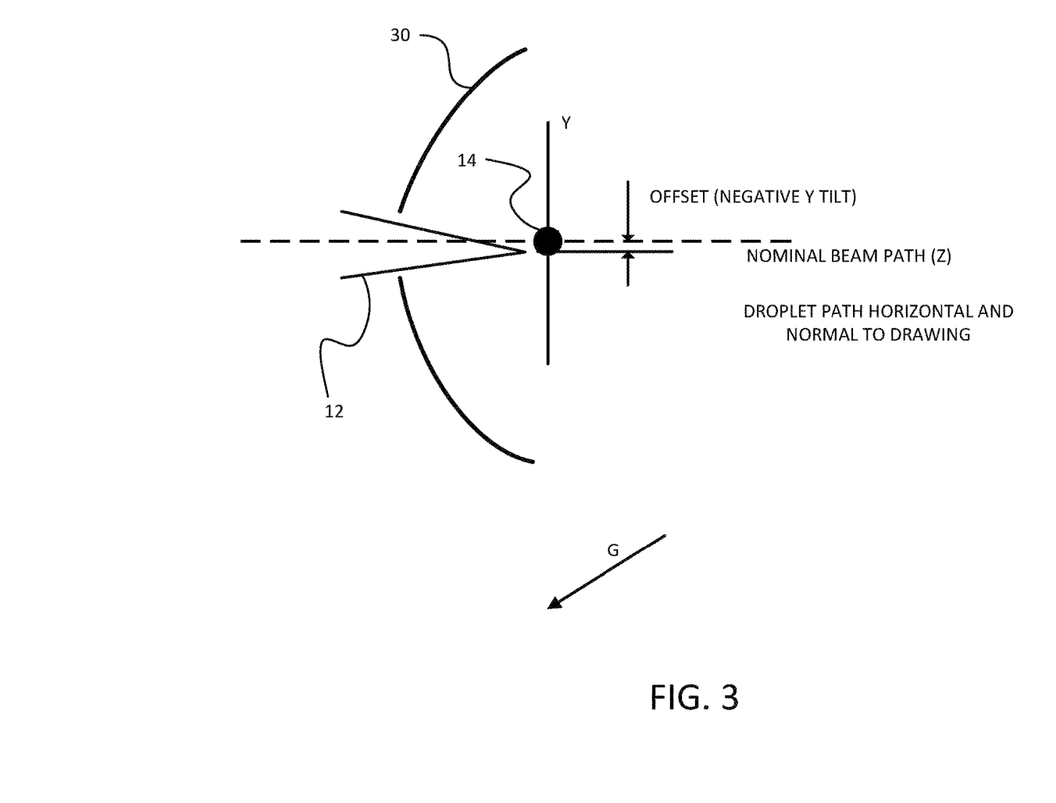
FIG. 3 is a diagram of the geometry of a possible interaction of a laser beam and a droplet of target material in a system such as the system of FIG. 1.

It has been noted that very small changes in Y-axis tilt of the $CO_2$ laser beam can lead to very significant changes in target material deposition without affecting EUV generation. FIG. 3 is a diagram to illustrate the concept of Y tilt as applied to the geometry of the interaction of the $CO_2$ laser beam 12 and the droplet 14. The Z axis is the direction along the nominal (no Y-tilt) propagation of the laser beam. Droplets travel along the X-axis, which is perpendicular to Z-axis and is horizontal in the global frame of reference. The Z-coordinate of the droplet travel path is Z=0. Y-tilt leads to the beam hitting slightly to one side of the center of the droplet as it travels through the beam focal spot. Thus, in the situation shown in FIG. 3, the beam 12 strikes the droplet (has a focal point at) to one side of the droplet 14 (below the nominal beam path or Z axis). This is described as negative Y-tilt. Y-tilt is measured as a displacement of the location the beam strikes the droplet from the location the beam strikes the droplet in the zero Y tilt condition. For example, a value of negative Y-tilt might typically be on the order of −10 microns. In FIG. 3, the droplet is shown as spherical but it will be understood that the droplet shape will not necessarily be spherical and may assume other shapes, for example, if flattened by a prepulse. The displacement is thus measured from the center of mass of the droplet.

The relative orientation of $CO_2$ beam and the droplet controls the flow of target material debris. If the $CO_2$ beam is dead center on the droplet then the target material debris tends to propagate in the direction of beam propagation parallel to Z axis. Shifting the center of the beam relative to the center of the droplet causes the flux of debris to be tilted, that is, to propagate with a component normal to the Z axis. The actual Y-tilt of the beam is negligibly small compared to the tilt of target material debris flux caused by the laser-droplet misalignment. An actual Y-tilt on the order of 20 microrads has been found to cause a shift in debris direction on the order of 0.1 rad or 5000 times larger.

It is not that important how the beam-droplet misalignment is achieved. It can be achieved by shifting the position of the center of the beam by steering the beam or it can be achieved by shifting the position of the droplet by manipulating its release point. It is also possible where the droplet trajectory has a vertical component to achieve the desired displacement/misalignment by controlling the timing of droplet release with respect to pulse timing by itself or in conjunction with droplet displacement and/or laser shift.

It has been determined that the rate of target material deposition on a given portion of the vessel for negative Y-tilt can be made markedly less than deposition rate for positive Y-tilt. The temperatures as measured by temperature sensors and are indicative of the rate of target material deposition were lower for the lower deposition rate, negative Y-tilt condition than for the higher deposition rate, positive Y-tilt condition. At the same time, the amount of Y-tilt involved (about 10 microns) and did not affect EUV production. Thus at negative tilt, which is tilting the $CO_2$ beam away from location of the temperature sensor, the target material deposition rate becomes very small, while at the positive Y-tilt (towards location of the temperature sensor), the target material accumulation rate reaches has a very high value.

It is presently preferred that the distance from the plasma to the temperature sensor location be in the range of about 200 mm to about 250 mm. The temperature sensor may be a "bare" thermocouple that has a metal junction exposed to the environment. Materials such as those making up such thermocouples have high recombination probability for H-radicals, and as a result this type of thermocouple measures a higher temperature value which is the sum of the gas temperature and extra heating due to H-radical recombination. The other type is a "glass" thermocouple in which the metal junction is inserted into a glass capillary to protect it from direct contact with the environment. The recombination probability for H-radicals on glass is much lower (about 1000 times lower) than on bare metal, so the glass thermocouple reads a lower value, determined only by gas temperature. As a practical matter, however, in the application in which the thermocouple is exposed to debris accumulation, a glass thermocouple will become coated with target material debris relatively quickly so that the difference in measured temperature is not significant. In the presently preferred embodiment bare thermocouples are used.

Figure 4:
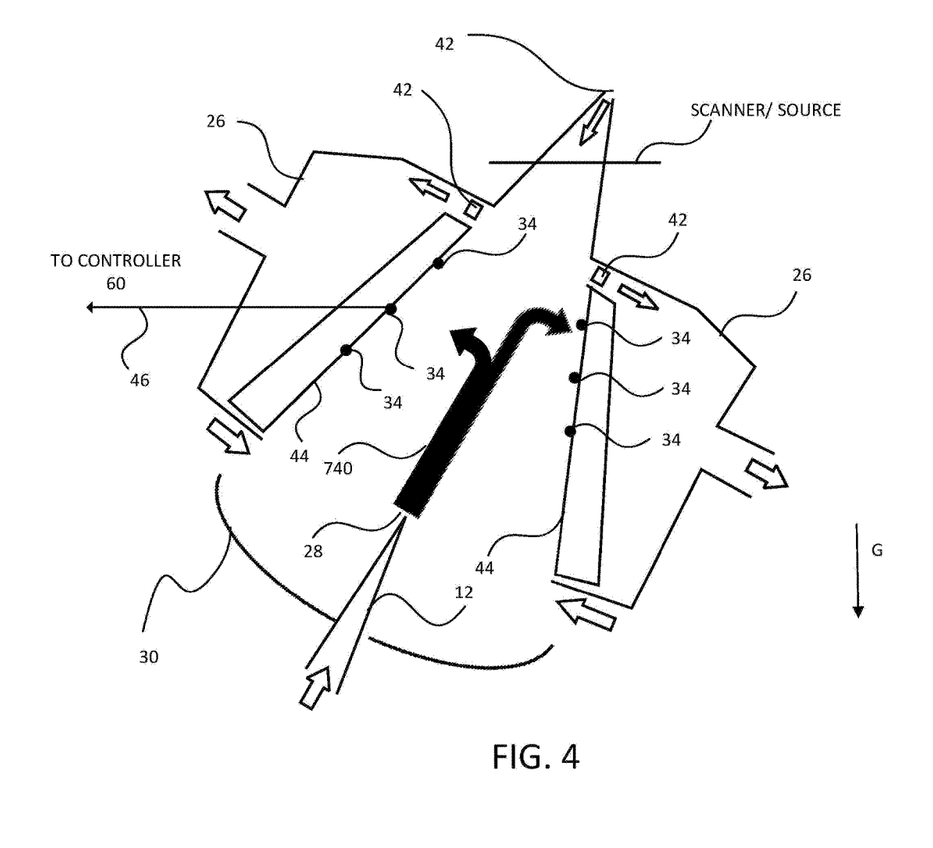
FIG. 4 is a not-to-scale perspective diagram showing a possible arrangement of temperature sensors in a vessel used in a laser-produced plasma EUV radiation source system according to an aspect of the present invention.

In order to create the desired control loop at least one thermocouple should be installed in the vessel in the areas where it is desired to minimize debris accumulation, i.e., minimize the flow of debris towards that area. As an example, one such area is may be the vessel walls directly above the collector. Target material debris accumulation in this area creates the risk that target material will drip onto the collector. FIG. 4 shows an example where the thermocouples 34 are positioned around the circumference of internal walls 44 of a rotationally symmetric vessel 26 at a position between the collector 30 and the intermediate location 40. FIG. 4 shows an arrangement in which six thermocouples 34 are used but it will be understood that fewer or more thermocouples may be used and that different arrangements and positioning of the thermocouples may be used. Each thermocouple is preferably configured as a small diameter wire (less than 1 mm in diameter) that protrudes into the gas for about 2 cm from the wall 44. For such a thermocouple, even if the wire protrudes somewhat into the path of EUV propagation, the total EUV loss will be negligible. The solid double arrow in FIG. 4 shows the direction of debris propagation. The outline arrows show a preferred arrangement for causing $H_2$ to flow away from the collector 30. Elements 42 are scrubbers for removing contaminants from the $H_2$. Arrow G indicates the direction of gravity. Also shown is a line demarking a division between the source 10 and the scanner 50.

The thermocouple temperature readings are supplied to the controller 60 as inputs. FIG. 4 shows one such connection 46 but it will be understood that each of the thermocouples 34 is connected to supply a signal to the controller 60. The controller 60 then controls the beam steering system 32 to adjust the beam tilt such that to minimize the readings from the thermocouples installed in the areas where it is desired to minimize debris accumulation. In one embodiment, the control loop made up of the thermocouple, controller, and beam steering system can be conceptualized as operating to minimize the error signal $Y_{err}$ according to the relationship $$Y_{err} = \Sigma(T_{i,\ protected}) / \Sigma(T_{i,\ all}),$$

where $\Sigma(T_{i,\ protected})$ is the sum of temperature readings over the area directly above collector and $\Sigma(T_{i,\ all})$ is the sum of all readings around the wall circumference.

The control loop adjusts Y-tilt to minimize the error signal. The total tilt $Y_{tilt\ CO2}$ is the sum of Y-tilt value set by the main control system operating to optimize EUV production, $Y_{tilt\ EUV}$, and the Y-tilt value correction set by the "debris loop" as described above, $V_{tilt\ Debris}$, thus:

$$Y_{tilt\ CO2} = Y_{tilt\ EUV} + Y_{tilt\ Debris}.$$

Preferably a maximum absolute value of $Y_{tilt\ Debris}$ should be limited to a predetermined value, preferably in the range of about 10 microns to about 20 microns. Of course, the preferred value will depend on the implementation of the "tilt." For example, if the target is flat, it may be possible to implement "tilt" by creating a displacement between the midpoint of the flat target and where it is struck by the beam to effect a change in the debris distribution.

It is believed that the measurement of local temperature provides useful information on the local concentration of Sn. The physical equations of convection and diffusion apply both to heat and Sn concentration. Also, the heat source and the Sn source largely coincide at the irradiation site. Therefore it is reasonable to infer that the measured temperature provides an indication of Sn concentration. This correlation is not necessarily uniform but is sufficient to provide an input to the control loop if care is taken to ensure measuring temperature at a location where the correlation can be expected to be strong. In principle, it is necessary only to locate the temperature sensor in a position in which there will be a significant signal to noise for the metrology and controller.

For example, it is preferred that the thermocouple be shielded from incoming EUV radiation to prevent sensing the wrong temperature. Also, the boundary conditions at the wall may cause the correlation to break down. Sn concentration at a wall may approach zero if Sn is permitted or caused to condense on the wall, and the wall may be temperature controlled. It is thus preferred that the thermocouple be placed far enough away from the nearest wall to prevent the boundary conditions at the wall from unduly distorting the temperature measurement. It is presently preferred that the temperature be measured at about 2 cm from the wall, but the temperature could be measured as far as 25 cm from the wall or farther. Each thermocouple is preferably configured as a small diameter wire (less than 1 mm in diameter) that protrudes into the gas for the preferred length. It also may be preferred for some applications to position another thermocouple at the opposite side of the chamber to develop a measurement of temperature near the wall in the presence of a higher or lower SN concentration.

As described above, the interaction between the incoming beam and the target material is controlled to affect the dispersion of target material in the chamber. The temperature at a given location is measured as an indication of the target material concentration at that location. The measured temperature is then used as an input to a control loop to control the beam/target material interaction to obtain a desired target material concentration at the location.

As an example in some systems using droplets of Sn the laser sequentially supplies two pulses to each droplet, a first pulse called a prepulse and a second pulse called a main pulse. The purpose of the prepulse is to precondition the droplet and the purpose of the main pulse is to vaporize the droplet after it has been conditioned by the prepulse. For example, if the prepulse strikes the droplet head-on then the target expands flat into what is referred to as a "flat target" which will present a flat face to the main pulse which is not tilted. The position where the droplet is vaporized is preferably the primary focus of the collector. In other words, to obtain a good, focused image of the vaporization event to be relayed to the scanner it is preferred to have the main pulse impact the target at the primary focus.

As described above, "tilt" may be achieved on by displacing the position where the prepulse strikes the droplet. This causes the target to expand at an angle, thus resulting in a tilted target for the main pulse. To create the displacement the droplet may be at the primary focus when struck and the laser is displaced, or the laser may be directed at the primary focus and there is a displacement between the droplet and the primary focus. The tilt is what determines the "tilted" debris emission. There are, however, different ways to affect the ion distribution (e.g., target shape; target tilt, main pulse displacement). Whichever method is used, the debris pattern as measured by the thermocouples is used as feedback in the control loop.

In other words, the beam-droplet interaction may be altered by adjusting the pointing (tilt) of the CO2 beam. It is also possible to adjust the beam-droplet interaction by adjusting the horizontal or vertical position at which the beam strikes the droplet. This can be accomplished by controlling the target delivery control system 90 to cause the target delivery mechanism 92 to change the release point of the droplet. It can also be accomplished by changing the relative timing of the droplet release and generation of the pulse in systems in which the droplet travels vertically. Controlling the droplet/beam interaction in this manner may have the advantage of reducing the amount of shift in the position of the plasma caused by the operation of the control loop.

After adjustment of either Y-tilt of $CO_2$ beam or the position of the droplet/beam interaction, both $CO_2$ beam and the droplet/beam interaction position can be moved (tilted or shifted) simultaneously to a new location (without affecting mutual alignment between the two) if adjustment in the plasma position is desired. This simultaneous shift of Y-tilt and the droplet/beam interaction position will not affect debris flux or EUV production. If further adjustment in either of the loop is required, however, the process can be repeated.

In yet another embodiment, the temperature reading can be used to direct the flow of debris in a predictable way, such as collinear with the Z-axis, for example, to minimize the target material deposition on the walls everywhere in the vessel. In this case the control loops could operate to minimize the value:

$$Y_{err} = \Sigma(T_{i, all}).$$

It is also possible to use this control loop to minimize debris flux onto the collector. In this case, the positions for the one or more temperature sensors should be shifted towards collector (along the Z axis). Also it is possible to install the temperature sensors in the areas which are determined to be the most sensitive indicators for debris based on computational fluid dynamics (CFD) simulations.

Thus, by using very small and simple temperature sensors such as thermocouples in the EUV source it is possible to design a debris control loop that allows for stabilizing, minimizing, and directing the entrained target material debris in the $H_2$ flows. The ability to direct flows away from surfaces which are positioned gravitationally above the collector could in particular be used to extend collector lifetime.

The above description includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. Apparatus for generating EUV radiation comprising:
   a vessel;
   a laser adapted to generate laser radiation;
   a laser steering system arranged to receive the laser radiation and adapted to steer the laser radiation to an irradiation region within the vessel;
   a target material delivery system adapted to deliver target material to the irradiation region to be irradiated by the laser, the irradiation of the target material by the laser generating the EUV radiation;
   a target material steering system coupled to the target material delivery system for adjusting a position of the target material within the irradiation region;
   an EUV radiation metrology system adapted to measure at least one operating parameter of the EUV radiation and to generate a first signal indicative of a value of the operating parameter;
   a temperature sensor arranged at a position within the vessel and adapted to measure a temperature within the vessel at the position and to generate a temperature signal indicative of a value of the measured temperature; and
   a controller adapted to receive the first signal and the temperature signal and to generate a control signal based at least in part on the measured temperature and to provide the control signal to at least one of the laser steering system and the target material steering system to adjust an angle at which the laser radiation strikes the target material in the irradiation region.

2. Apparatus as claimed in claim 1 further comprising an EUV optical element located within the vessel and wherein the position at which the temperature sensor is arranged is gravitationally above the EUV optical element.

3. Apparatus as claimed in claim 2 wherein the EUV optical element comprises a collector mirror.

4. Apparatus as claimed in claim 1 wherein the position at which the temperature sensor is arranged is on an internal surface of a vessel wall of the vessel.

5. Apparatus as claimed in claim 1 wherein the temperature sensor comprises a thermocouple.

6. Apparatus as claimed in claim 1 further comprising a second temperature sensor arranged at a second position within the vessel and adapted to measure a second temperature within the vessel at the second position and to generate a second temperature signal indicative of a value of the second measured temperature and wherein the controller is adapted to receive the second temperature signal and to generate the control signal based at least in part on the second measured temperature.

7. Apparatus for generating EUV radiation comprising:
   a vessel;
   a laser adapted to generate laser radiation;
   a laser steering system arranged to receive the laser radiation and adapted to steer the laser radiation to an irradiation region within the vessel;
   a target material delivery system adapted to deliver target material to the irradiation region to be irradiated by the laser, the irradiation of the target material by the laser generating the EUV radiation;
   an EUV optical element located within the vessel;
   a first temperature sensor arranged at a first position within the vessel gravitationally above the EUV optical element and adapted to measure a first measured temperature within the vessel at the first position and to generate a first temperature signal indicative of a value of the first measured temperature;
   a second temperature sensor arranged at a second position within the vessel and adapted to measure a second temperature of a gas within the vessel at the second position and to generate a second temperature signal indicative of a value of the second measured temperature; and a controller adapted to receive the first signal and the temperature signal and to generate a control signal based at least in part on the first measured temperature and the second measured temperature to provide the control signal to the laser steering system to adjust an angle at which the laser radiation strikes the target material in the irradiation region.

8. Apparatus as claimed in claim 7 wherein the EUV optical element comprises a collector mirror.

9. Apparatus as claimed in claim 7 wherein the first temperature sensor is arranged is on an internal vessel wall of the vessel and the second temperature sensor is arranged is on an internal vessel wall of the vessel.

10. Apparatus as claimed in claim 7 wherein the first temperature sensor comprises a first thermocouple and the second temperature sensor comprises a second thermocouple.

11. Apparatus for generating EUV radiation comprising:
a vessel;
a laser adapted to generate a laser beam;
a laser steering system arranged to receive the laser beam and adapted to direct the laser beam to and adjust a tilt of the laser beam in an irradiation region within the vessel;
a target material delivery system adapted to deliver target material to the irradiation region to be irradiated by the laser beam, the irradiation of the target material by the laser beam generating the EUV radiation;
a temperature sensor arranged at a position within the vessel and adapted to measure a temperature within the vessel at the position and to generate a temperature signal indicative of a value of the measured temperature; and
a controller adapted to receive the temperature signal and to generate a control signal based at least in part on the value of the temperature signal and to provide the control signal to the laser steering system to adjust the tilt of the laser beam.

12. Apparatus as claimed in claim 11 wherein the tilt is adjusted to maintain the temperature below a predetermined maximum value.

13. Apparatus as claimed in claim 11 further comprising a second temperature sensor arranged at a second position within the vessel and adapted to measure a second temperature within the vessel at the second position and to generate a second temperature signal indicative of a second value of the measured temperature and wherein the controller is further adapted to receive the second temperature signal and to generate the control signal based at least in part on the second value of the second temperature signal and to provide the control signal to the laser steering system to adjust the tilt of the laser beam.

14. Apparatus as claimed in claim 13 further comprising an EUV optical element located within the vessel and wherein the position at which the temperature sensor is arranged is gravitationally above the EUV optical element.

15. Apparatus as claimed in claim 14 wherein the EUV optical element comprises a collector mirror.

16. Apparatus as claimed in claim 14 wherein the vessel has a vessel wall having an internal surface and the position at which the temperature sensor is arranged is on the internal surface of the vessel wall.

17. Apparatus as claimed in claim 13 wherein the temperature sensor comprises a thermocouple and the second temperature sensor comprises a thermocouple.

18. Apparatus for generating EUV radiation comprising:
a vessel;
a laser adapted to generate a laser beam;
a laser steering system arranged to receive the laser beam and adapted to direct the laser beam to and adjust a tilt of the laser beam in irradiation region within the vessel;
a target material delivery system adapted to deliver target material to the irradiation region to be irradiated by the laser beam, the irradiation of the target material by the laser beam generating the EUV radiation;
a plurality of temperature sensors arranged at respective positions within the vessel and adapted to measure a temperature within the vessel at the respective position and to generate a plurality of temperature signals indicative of values of the measured temperatures; and
a controller adapted to receive the plurality of temperature signals and to generate a control signal based at least in part on the value of the temperature signals and to provide the control signal to the laser steering system to adjust the tilt of the laser beam.

19. Apparatus as claimed in claim 18 further comprising an EUV optical element located within the vessel and wherein the position at which at least one of the plurality of temperature sensors is arranged is gravitationally above the EUV optical element.

20. Apparatus as claimed in claim 18 wherein each of the plurality of temperature sensors comprises a thermocouple.

* * * * *